United States Patent
Bains

(10) Patent No.: US 8,411,523 B2
(45) Date of Patent: Apr. 2, 2013

(54) REDUCED CURRENT REQUIREMENTS FOR DRAM SELF-REFRESH MODES VIA STAGGERED REFRESH OPERATIONS OF SUBSETS OF MEMORY BANKS OR ROWS

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 12/890,083

(22) Filed: Sep. 24, 2010

(65) Prior Publication Data

US 2012/0079183 A1    Mar. 29, 2012

(51) Int. Cl.
*G11C 7/00* (2006.01)
(52) U.S. Cl. .............. 365/222; 365/230.03; 365/227; 365/228
(58) Field of Classification Search ............ 365/227, 365/228, 226, 222, 230.03
See application file for complete search history.

(56) References Cited

U.S. PATENT DOCUMENTS

| | | | | |
|---|---|---|---|---|
| 5,535,169 | A * | 7/1996 | Endo et al. .......... | 365/189.04 |
| 6,518,595 | B2 * | 2/2003 | Lee .................... | 257/66 |
| 6,665,224 | B1 * | 12/2003 | Lehmann et al. ....... | 365/222 |
| 6,859,407 | B1 * | 2/2005 | Suh .................... | 365/222 |
| 7,260,010 | B2 | 8/2007 | Kwak et al. | |
| 7,457,185 | B2 * | 11/2008 | Kim ................... | 365/222 |
| 2007/0070765 | A1 | 3/2007 | Kim | |
| 2009/0249169 | A1 | 10/2009 | Bains et al. | |
| 2009/0327660 | A1 | 12/2009 | Bains et al. | |

FOREIGN PATENT DOCUMENTS

KR    20060020871    3/2006

OTHER PUBLICATIONS

"International Search Report and Written Opinion of the International Searching Authority for Application No. PCT/US2011/053315", (Feb. 28, 2012), Whole Document.

\* cited by examiner

*Primary Examiner* — Andrew Q Tran
(74) *Attorney, Agent, or Firm* — Blakely, Sokoloff, Taylor & Zafman LLP

(57) ABSTRACT

Embodiments of the invention describe systems, methods, and apparatuses to reduce the instantaneous power necessary to execute a DRAM device initiated self-refresh. Embodiments of the invention describe a DRAM device enabled to stagger self-refreshes between a plurality of banks. Staggering self-refreshes between banks reduces the current required for a DRAM self-refresh, thus reducing the amount of current required by the DRAM device.

17 Claims, 5 Drawing Sheets

REDUCED CURRENT REQUIREMENTS FOR DRAM SELF-REFRESH MODES VIA STAGGERED REFRESH OPERATIONS OF SUBSETS OF MEMORY BANKS OR ROWS

FIELD

Embodiments of the invention generally pertain to electronic devices, and more particularly to systems, apparatuses and methods to save dynamic random access memory (DRAM) self-refresh power.

BACKGROUND

Memory cells in a DRAM device include a transistor and a capacitor to store a bit of data. The memory cells are 'dynamic' because their data decays and becomes invalid due to various leakage current paths to surrounding cells and to the substrate of the device. To keep the data in the cells valid, each memory cell is periodically refreshed. Data in DRAM memory cells are refreshed every time the data is read out of the cell array into the sense amplifiers and subsequently rewritten into the cell.

DRAM devices consistent with the double data rate specification 3 (DDR3, as defined by JEDEC JESD79-3) have internal charge pumps that pump up the voltage from 1.5V (Vdd) to the voltage requirements required for word line boosts. The word line boost voltage is used during activation of a DRAM row (i.e., for opening a DRAM page). This internal voltage level varies across DRAM devices, but is generally in the range of 2.5-3.3V for a DDR3 device. The charge pumps included in these DRAM devices are 5-10% efficient and take up a significant die size area.

Proposed DDR4 specifications would instead allow DRAM devices to receive an external Voltage (Vpp) for DRAM internal word-line boosts. Vpp for these devices may be, for example, 3.3V as this value is readily available from the platform. These DRAM devices may internally regulate received power from 3.3V to the desired internal voltage level (e.g., ~2.5V), or a memory module including these devices may include a voltage regulator (VR) to regulate the received power. Thus, it is understood that the elimination of charge pumps provides device power and die size savings.

DDR4 devices may receive Vpp via a DIMM connector. The worst case scenario for Vpp power is when all ranks on a DIMM and, as illustrated in FIG. 1 (discussed in further detail below), all banks included in the DRAM devices of said ranks are refreshed simultaneously. Power provided to said devices must account for this scenario.

The current requirement for Ipp may be, for example, ~30 mA/device (for 2 Gbit DRAM devices including 16 banks). If, for example, there are 8 ranks with 18 devices each, then the max current requirement is 8×18×30=4.32 A. The DIMM connector would require 6 separate pins to receive this power, assuming each pin has a 0.75 A current carrying capability (i.e., 4.32 A/0.75 A per pin=6 pins). This current requirement may also require a new VR on some platforms as the current capability of existing 3.3V VRs may not be sufficient to receive 4.32 A current.

Thus, DRAM devices are needed that do not have as high of a current requirement to execute a self-refresh mode.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as a discussion of other potential embodiments or implementations of the inventive concepts presented herein. An overview of embodiments of the invention is provided below, followed by a more detailed description with reference to the drawings.

DESCRIPTION

Embodiments of the invention describe systems, methods, and apparatuses to reduce the power necessary to execute a DRAM device initiated self-refresh. Embodiments of the invention describe a DRAM device able to stagger self-refreshes between a plurality of banks. Staggering these self-refreshes reduces the maximum current required for a DRAM initiated self-refresh, thus reducing the peak or instantaneous power required by the device.

Every row of cells in a DRAM memory array needs to be refreshed before the data in the row decays to an invalid state. There are two types of refreshes, external refreshes and internal refreshes (i.e., the DRAM device places itself in self-refresh mode and manages its own refreshes). When the memory controller manages refreshes, the controller may easily stagger the refreshes between ranks in order to reduce the instantaneous current necessary to perform a refresh. When a DRAM device is internally managing its refreshes, then the refreshes may potentially overlap each other.

Figure 1:
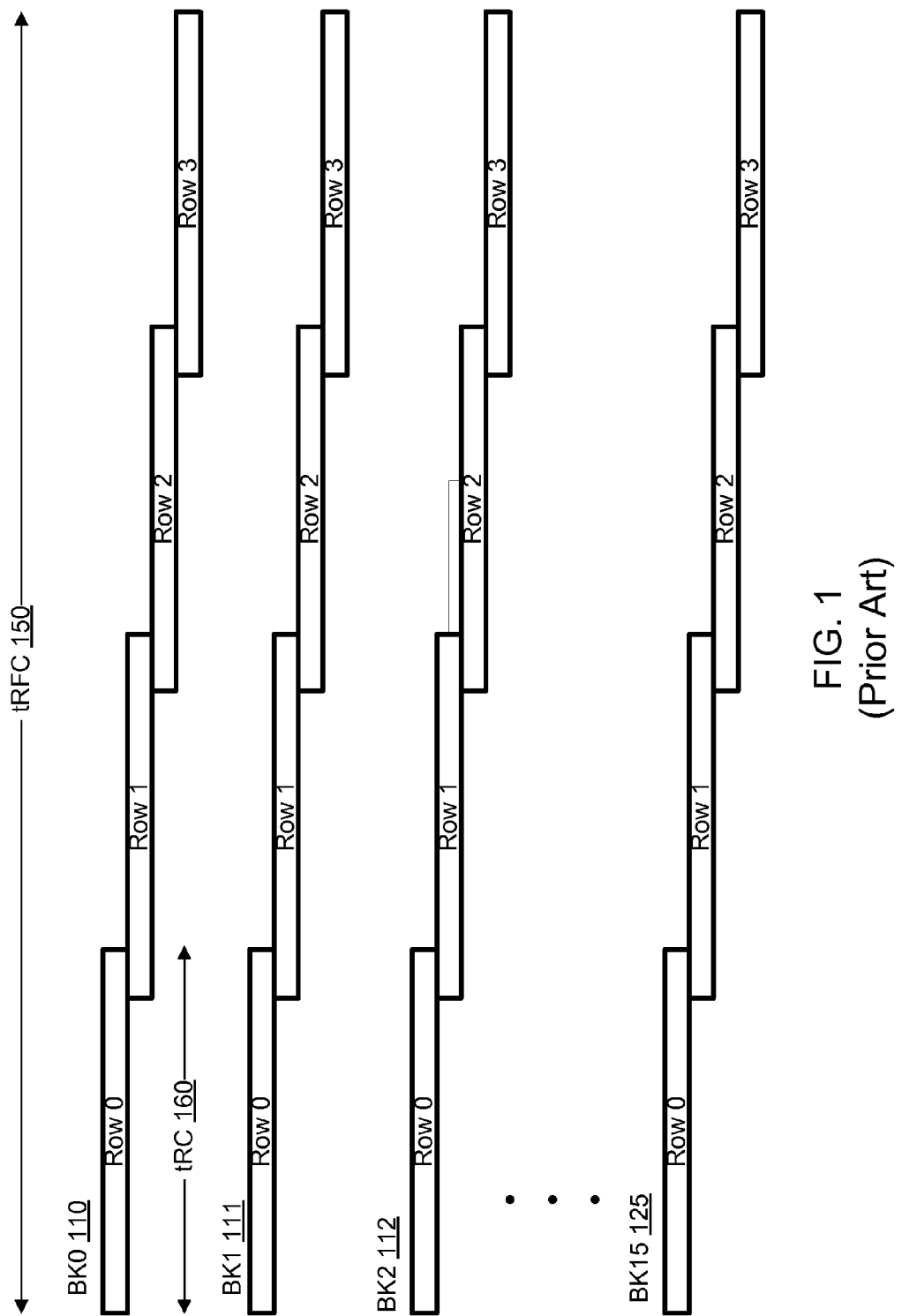
FIG. 1 illustrates a DRAM refresh cycle according to the prior art

FIG. 1 illustrates a DRAM refresh cycle according to the prior art. This diagram shows a potential self-refresh cycle for a 16-bank (BK0 110-BK15 125) DRAM device.

The device in FIG. 1 is presumed to be a DDR3 device, which has a refresh period of 64 ms and a refresh interval of 7.8 us. This translates to 8 K refresh commands during the refresh period (64 ms/7.8 us=8 K). The device in FIG. 1 is further presumed to have 32 K rows per bank. Thus each refresh command in this example will refresh four rows of memory (32K/8K=4) for each bank. It is to be understood that the number of rows that are refreshed in each bank per command may vary, and that the four rows per bank illustrated is an example only.

Although ranks of DRAM devices may be designed to initiate self-refreshes for each rank in a staggered fashion, over time these refreshes may drift due to voltage, temperature and drift in the oscillator. Thus, refreshes to devices across multiple ranks (wherein each rank includes at least one device employing the DRAM self-refresh cycle as shown in FIG. 1) may be triggered concurrently even if they were initially designed to be staggered, and the current of the power provided to the DRAM devices (Ipp) must account for this scenario.

By enabling a DRAM device to stagger self-refreshes between banks, it is understood that the current value of the power provided to the device no longer has to account for the possibility of all banks refreshing concurrently in the event of multiple ranks executing refreshes concurrently. Therefore, embodiments of the invention allow for a reduced current to be supplied to DRAM devices.

In the self-refresh cycle illustrated in FIG. 1, tRFC 150 is the self-refresh cycle of the DRAM device, while tRC 160 is the refresh cycle of a row. It will be understood that staggering the self-refreshes between banks will increase a device's tRFC, and thus in the embodiments described below tRFC is inversely proportionally to the required value of Ipp.

Figure 2:
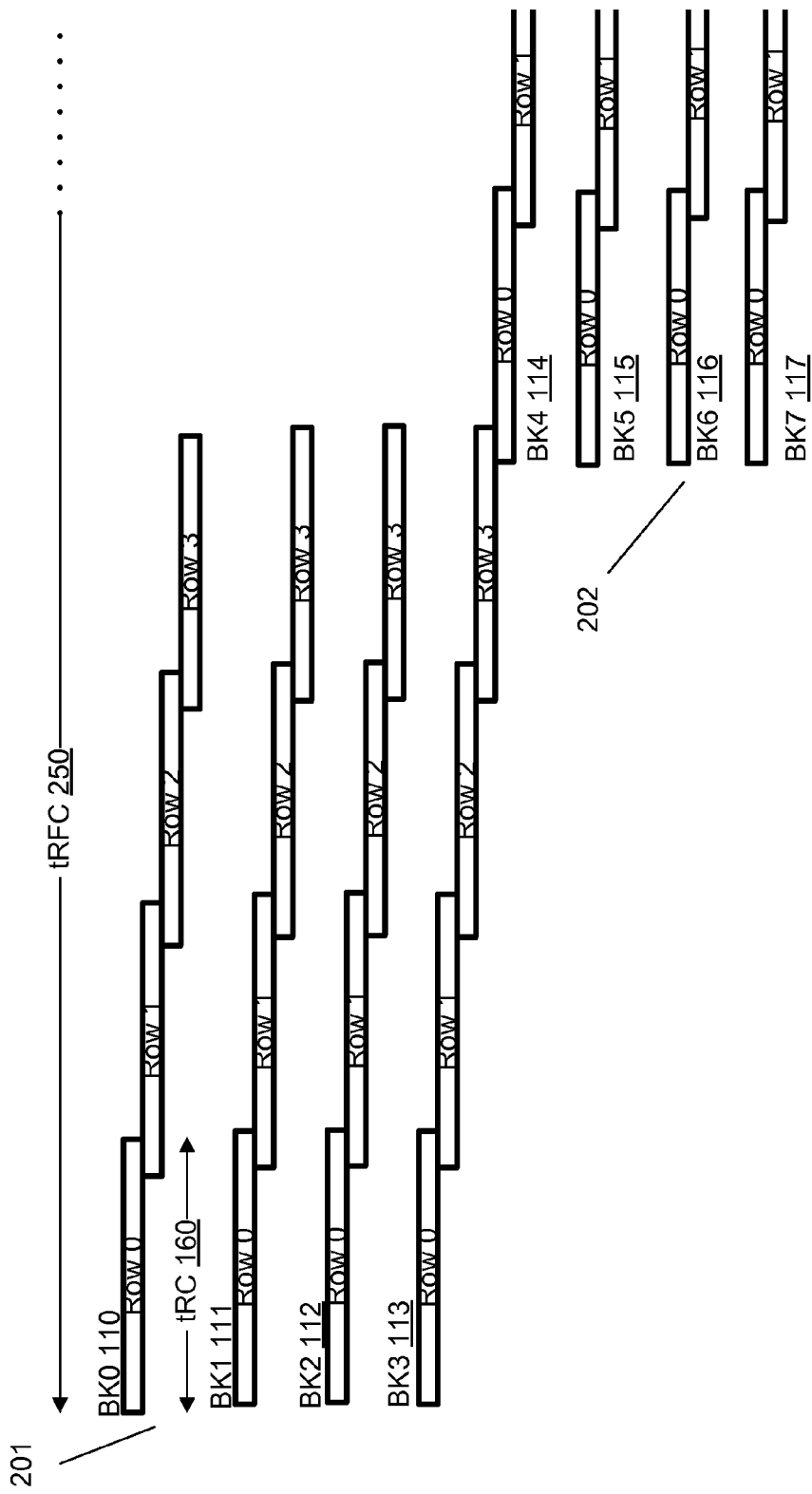
FIG. 2 illustrates a DRAM refresh cycle according to an embodiment of the invention.

FIG. 2 illustrates a DRAM refresh cycle according to an embodiment of the invention. This diagram shows a potential self-refresh cycle for the 16-bank (BK0 110-BK15 125) DRAM device in FIG. 1.

In FIG. 2, banks BK0 110-BK15 125 of the DRAM device are organized as a plurality of subsets of banks. In this example, each subset includes 4 banks—i.e., subset 201 including BK0-BK3, subset 202 including BK4-BK7, a third subset including BK8-BK11 (not shown) and a fourth subset including BK12-BK15 (not shown). The self-refresh mode in this embodiment staggers the refreshes of each subset. Thus, at most 4 banks may be refreshed concurrently (e.g., BK0-BK3 are refreshed concurrently, etc.).

It is to be understood that by reducing the number of banks that may be refreshed concurrently, the Ipp required by the device is similarly reduced. In this example, the Ipp required by the device of FIG. 2 must only be sufficient for a concurrent self-refresh of 4 banks per DRAM device (i.e., the Ipp required by the DRAM device described by FIG. 2 is ¼ of the Ipp required by the DRAM device described by FIG. 1). It is also understood that the number of pins required by the DIMM connector to receive device power is reduced by a similar factor.

Conversely, as Ipp is reduced tRFC 250 is increased compared to tRFC 150 of FIG. 1. tRFC 250 is the amount of time it takes to refresh all subsets of banks of the DRAM device. In this example, tRFC 250 is equal to the refresh time of all four subsets of banks. tRFC 250 in this example is about 4 times as long as tRFC 150 of FIG. 1.

It is to be understood that determining each of the subsets are to include four banks may be determined by design, or by the power the DRAM device receives (i.e., the current of the power received by the DRAM device may require each subset to include four banks).

Figure 3:
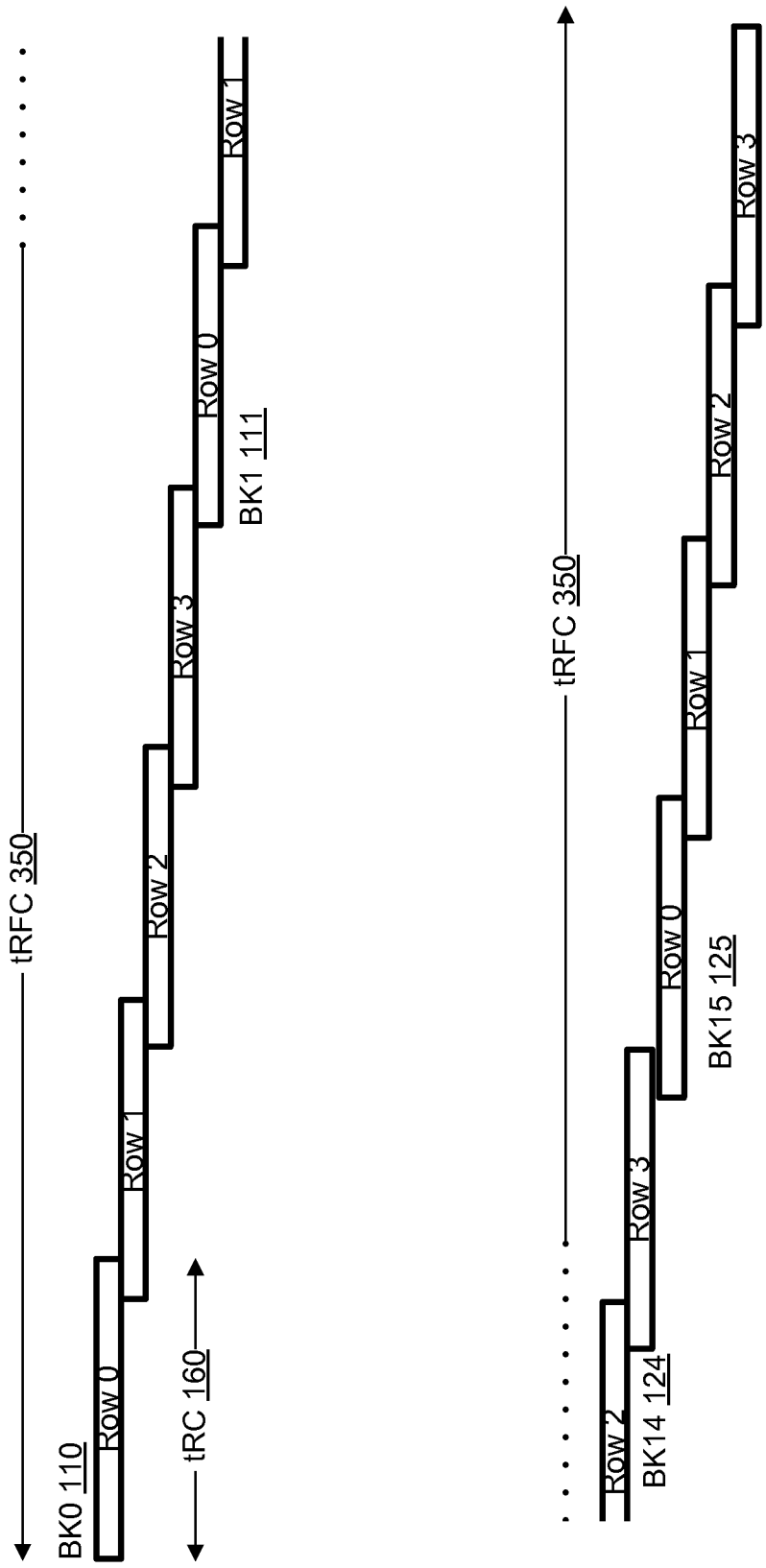
FIG. 3 illustrates a DRAM refresh cycle according to an embodiment of the invention.

FIG. 3 illustrates a DRAM refresh cycle according to an embodiment of the invention. This diagram shows a potential self-refresh cycle for the 16-bank (BK0 110-BK15 125) DRAM device of FIG. 1.

In this example, each subset includes a single bank only (i.e., each of banks BK0 110-BK15 125 is its own separate subset). As described above, the self-refresh mode staggers the refreshes of each subset; however in this embodiment no banks are initiated concurrently—they are all staggered to self-refresh one at a time (or slightly overlap as in FIG. 3—e.g., BK14 124 row 3 slightly overlaps BK15 125 row 0).

It is to be understood that in this example, the Ipp required by the DRAM device of FIG. 3 must only be sufficient for a self-refresh of 1 bank, as no banks of the device are refreshed concurrently (i.e., the Ipp required by the DRAM device described by FIG. 3 is 1/16 of the Ipp required by the DRAM device described by FIG. 1). It is also understood that the number of pins required by the DIMM connector to receive device power is reduced by a similar factor.

Conversely, as Ipp is reduced tRFC 350 is increased. In this example, tRFC 350 is the amount of time it takes to refresh all subsets of banks of the DRAM device. In this example, tRFC 350 is equal to approximately the refresh time of all 16 banks of the DRAM device. It is to be understood that tRFC 350 in this example is roughly 16 times as long as tRFC of FIG. 1. Because of the increased value of tRFC 350 in this embodiment, an self-refresh abort process may be utilized to prevent a prolonged latency for a memory controller.

It is to be understood that determining each of the subsets are to consist of one bank may be determined by design, or by the power the DRAM device receives (i.e., the current of the power received by the DRAM device may require each subset consist of one bank).

Figure 4:
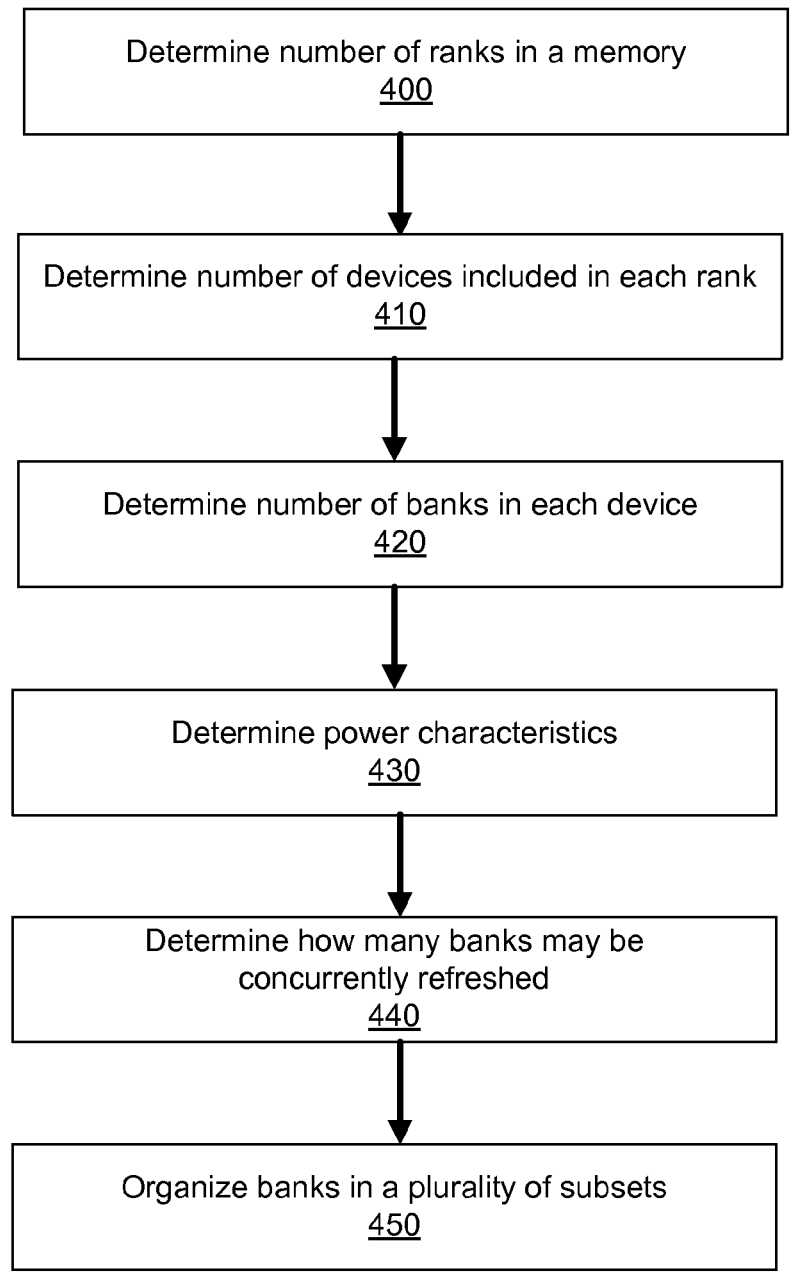
FIG. 4 is a flow diagram describing an embodiment of the invention.

FIG. 4 is a flow diagram describing an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible. Operations described below may be executed via logic, circuitry or modules included in a DRAM device.

The number of ranks included in a memory sub-system may be determined, 400. The number of devices included in each of said ranks may be determined, 410. The number of banks included in each device may be determined, 420.

Characteristics of the power provided to the memory are determined, 430. Said characteristics may include the amount of power provided to the memory, the voltage requirements of memory, and the current value of the power provided to the memory.

A limit for the number of banks or rows that may be concurrently refreshed in each device based on said power characteristics is determined, 440. This limit may be used to determine a plurality of subsets of banks to be concurrently refreshed, each subset to include at least one of the plurality of banks, 450 (or similarly, to determine a plurality of subsets of rows for each bank to be concurrently refreshed). As discussed above, this subset may include any number less than the total number of banks included in a DRAM device (e.g., subsets including 4 banks as in FIG. 2, subsets consisting of 1 bank as in FIG. 3). It is to be understood that each subset may include any number of banks, as long as it is less than the total number of banks included in a DRAM device in order to reduce the Ipp necessary for a self-refresh. It is to be understood that these subsets may include an unequal number of banks (e.g., in a 16 bank device, there may be three subsets including 6, 6 and 4 banks respectively).

The operations described above may be executed by the memory or any device included in a system. In one embodiment, the information determined in operations 400-420 is included in the memory, and retrieved by a basic input/output system (BIOS). A memory controller may further enable a DRAM device to execute self-refreshes in the manner described above. In one embodiment, the DRAM device executes self-refreshes as known in the prior art (i.e., FIG. 1) unless the device is enabled by a memory controller to execute a staggered refresh of a subset of banks or rows as described above.

Figure 5:
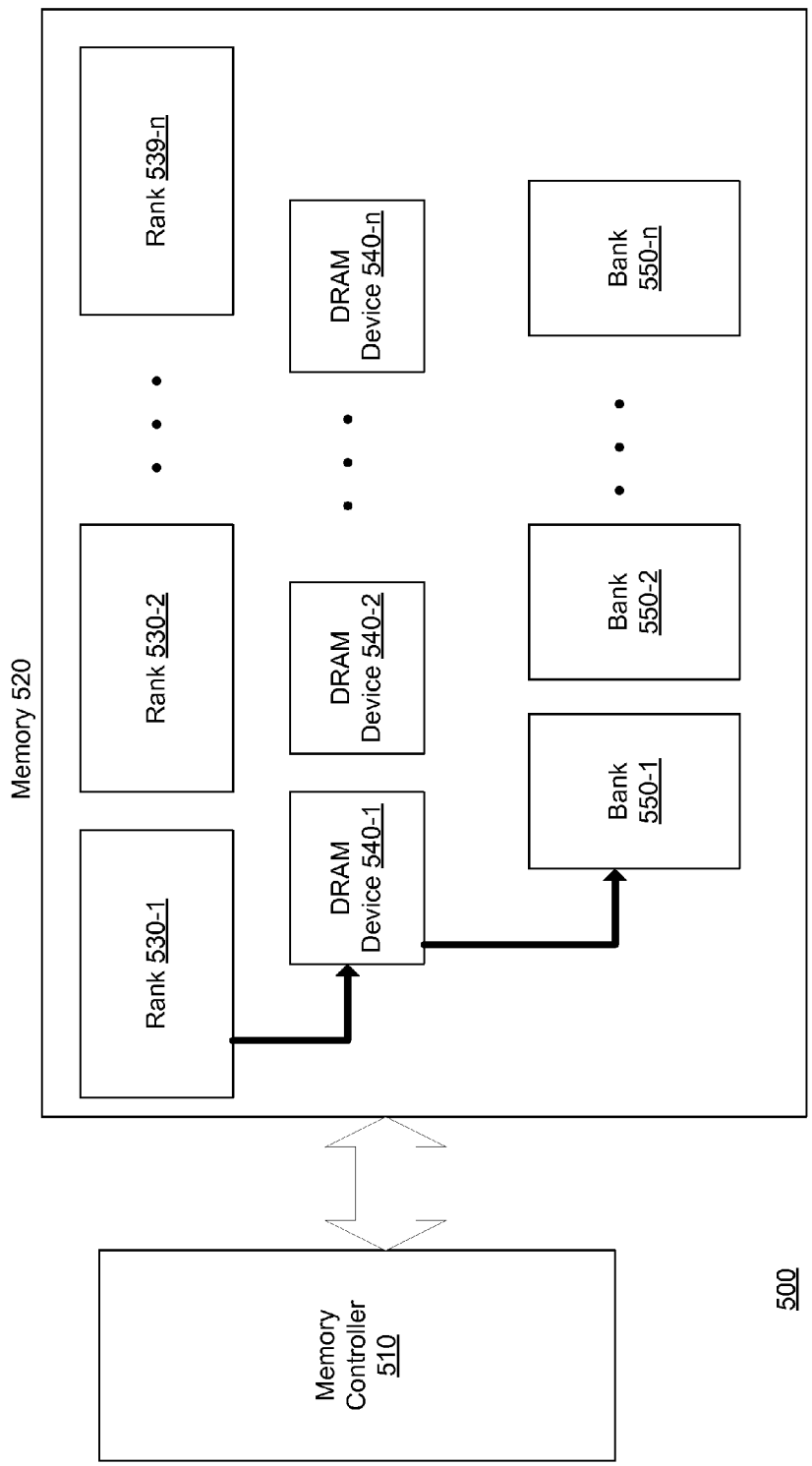
FIG. 5 is a block diagram of components of a system utilizing an embodiment of the invention.

FIG. 5 is a block diagram of components of a system utilizing an embodiment of the invention. System 500 may include memory controller 510 and memory 520. Memory 520 may include a plurality of ranks, 530-1 to 530-n. Each rank may include a plurality of DRAM devices (e.g., rank 530 includes devices 540-1 to 540-n, and so forth). Each DRAM device may include a plurality of banks (e.g., device 540 includes banks 550-1 to 550-n, and so forth). Each bank may include a plurality of rows.

In this embodiment, the maximum current requirement is for memory 520 is determined by the number of ranks, multiplied by the number of devices in each rank, multiplied by the self-refresh current requirements for each device. As described above, self-refresh current requirements for each device may be reduced by employing a staggered self-refresh process as described above, thereby reducing the maximum current requirement for DRAM devices 540-1 to 540-n (and thus the maximum current requirement for memory 520).

Various components referred to above as processes, servers, or tools described herein may be a means for performing the functions described. Each component described herein includes software or hardware, or a combination of these. The components can be implemented as software modules, hardware modules, special-purpose hardware (e.g., application specific hardware, ASICs, DSPs, etc.), embedded controllers, hardwired circuitry, etc. Software content (e.g., data, instructions, configuration) may be provided via an article of manufacture including a computer storage readable medium, which provides content that represents instructions that can be executed. The content may result in a computer performing various functions/operations described herein. A computer readable storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. A system comprising:
   a dynamic random access memory (DRAM) device to execute a self-refresh mode, the DRAM device including a plurality of banks, each bank to include a plurality of rows, the self-refresh mode to include a plurality of commands, each command to refresh rows of one of the banks;
   a memory controller operatively coupled to the DRAM device; and
   logic, operatively coupled to the DRAM device and the memory controller, to:
      determine the number of banks included in the DRAM device,
      determine characteristics of power supplied to the DRAM device, and
      determine a plurality of subsets of banks or rows to be concurrently refreshed in the self-refresh mode, wherein determining the plurality of subsets to be concurrently refreshed is based, at least in part, on the characteristics of power supplied to the DRAM device;
   the DRAM device to execute the self-refresh mode for each of the plurality of subsets in a staggered fashion.

2. The system of claim 1, wherein each of the plurality of subsets includes half of the number of banks included in the DRAM device.

3. The system of claim 1, wherein each of the plurality of subsets consists of one of the plurality of banks.

4. The system of claim 1, the memory controller to transmit a signal to the DRAM device to enable the DRAM device to execute the self-refresh mode for each of the plurality of subsets in the staggered fashion.

5. The system of claim 1, the logic included in a basic input/output system (BIOS).

6. The system of claim 1, each command of the self-refresh mode to refresh a subset of rows of one of the banks 7. A method comprising:
   determining the number of banks included in a DRAM device, the DRAM device to include a plurality of banks, each bank to include a plurality of rows;
   determining characteristics of power supplied to the DRAM device;
   determining a plurality of subsets of banks or rows to be concurrently refreshed in a self-refresh mode based, at least in part, on the characteristics of power supplied to the DRAM device, the self-refresh mode to include a plurality of commands, each command to refresh rows of one of the banks; and
   executing the self-refresh mode for each of the plurality of subsets in a staggered fashion.

8. The method of claim 7, wherein each of the plurality of subsets comprises half of the number of banks included in the DRAM device.

9. The method of claim 7, wherein each of the plurality of subsets consists of one of the plurality of banks.

10. The method of claim 7, further comprising:
    receiving a signal at the DRAM device to enable the device to execute the self-refresh mode for each of the plurality of subsets in the staggered fashion.

11. The method of claim 7, each command of the self-refresh mode to refresh a subset of rows of one of the banks.

12. An apparatus comprising:
    a plurality of DRAM banks, each DRAM bank to include a plurality of rows;
    a first logic, operatively coupled to the DRAM banks, to determine characteristics of power supplied to the apparatus; and
    a second logic, operatively coupled to the DRAM banks and the first logic, to:
       execute a self-refresh mode for the plurality of subsets of DRAM banks or rows in a staggered fashion, the self-refresh mode to include a plurality of commands, each command to refresh rows of one of the DRAM banks; and
       determine the plurality of subsets to be refreshed based, at least in part, on the characteristics of power supplied to the apparatus.

13. The apparatus of claim 12, wherein each of the plurality of subsets comprises half of the number of DRAM banks.

14. The apparatus of claim 12, wherein each of the plurality of subsets consists of one of the plurality of DRAM banks.

15. The apparatus of claim 12 wherein the second logic to further:

receive a signal from a memory controller to enable the apparatus to execute the self-refresh mode for each of the plurality of subsets in the staggered fashion.

16. The apparatus of claim 12, each command of the self-refresh mode to refresh a subset of rows of one of the DRAM banks.

17. The apparatus of claim 12, wherein the characteristics of power supplied to the apparatus comprises at least one of an amount of the power supplied to the apparatus, a voltage requirement of the apparatus, or a current value of the power supplied to the apparatus.

* * * * *